US011239807B1

(12) United States Patent
Price et al.

(10) Patent No.: US 11,239,807 B1
(45) Date of Patent: Feb. 1, 2022

(54) OFFSET COMPENSATED DIFFERENTIAL AMPLIFIER AND CALIBRATION CIRCUIT PROVIDING INCREASED LINEAR RANGE AND GRANULARITY OF OFFSET COMPENSATION AND RELATED METHOD

(71) Applicant: Microsoft Technology Licensing, LLC, Redmond, WA (US)

(72) Inventors: Burt L. Price, Apex, NC (US); Jin Liang, Apex, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/108,730

(22) Filed: Dec. 1, 2020

(51) Int. Cl.
  *H03F 3/45* (2006.01)
  *H03G 1/00* (2006.01)

(52) U.S. Cl.
  CPC ....... *H03F 3/45183* (2013.01); *H03G 1/0023* (2013.01); *H03F 2200/375* (2013.01); *H03F 2203/45026* (2013.01); *H03F 2203/45048* (2013.01)

(58) Field of Classification Search
  CPC .. H03F 3/45; H03F 3/45183; H03F 2200/375; H03F 2203/45048; H03F 2203/45026; H03F 3/45071; H03F 3/45973; H03F 2200/153; H03F 2200/78; H03F 3/45475; H03F 1/303; H03F 3/45179; H03F 3/45192; H03G 1/0023
  USPC ...................................................... 330/9, 253
  See application file for complete search history.

(56) References Cited

U.S. PATENT DOCUMENTS

| | | | |
|---|---|---|---|
| 4,965,528 | A | 10/1990 | Okanobu |
| 5,006,818 | A | 4/1991 | Koyama et al. |
| 5,079,515 | A | 1/1992 | Tanimoto |
| 5,420,538 | A | 5/1995 | Brown |
| 5,972,166 | A | 10/1999 | Helwig et al. |

(Continued)

OTHER PUBLICATIONS

Gilbert, Barrie, "The Multi-tanh Principle: A Tutorial Overview", In IEEE Journal of Solid-State Circuits, vol. 33, Issue 1, Jan. 1998, 16 Pages.

*Primary Examiner* — Khanh V Nguyen
(74) *Attorney, Agent, or Firm* — Withrow & Terranova, PLLC

(57) ABSTRACT

An offset compensated differential amplifier employing a multi-tan h circuit comprising differential pairs coupled in parallel to compensate for an offset voltage of the output voltage in the offset compensation calibration mode is disclosed. The differential pairs each include a compensation transistor coupled to the positive internal node and a reference transistor coupled to the negative internal node. Each compensation transistor receives the compensation control voltage and each reference transistor receives a different reference voltage. The multi-tan h circuit generates an offset compensation voltage on the positive and negative internal nodes based on a difference between the compensation control voltage and the different reference voltages. The multi-tan h circuit comprises a larger linear range than a hyperbolic tangent current transfer function of a single differential pair. The offset compensated differential amplifier provides offset compensation with improved linearity and a finer granularity compared to a conventional differential amplifier.

20 Claims, 9 Drawing Sheets

(56) References Cited

U.S. PATENT DOCUMENTS

| | | | |
|---|---|---|---|
| 8,400,337 B1 * | 3/2013 | Xu ..................... | H03F 3/45766 |
| | | | 341/118 |
| 9,712,126 B2 * | 7/2017 | Price ................... | H03F 3/45973 |
| 10,418,954 B1 * | 9/2019 | Price ................... | H03F 3/45475 |
| 2017/0047903 A1 | 2/2017 | Price et al. | |

* cited by examiner

OFFSET COMPENSATED DIFFERENTIAL AMPLIFIER AND CALIBRATION CIRCUIT PROVIDING INCREASED LINEAR RANGE AND GRANULARITY OF OFFSET COMPENSATION AND RELATED METHOD

FIELD OF THE DISCLOSURE

The technology of the disclosure relates to differential amplifiers and particularly to compensating offsets in differential amplifier input voltages.

BACKGROUND

A differential amplifier is a device that receives input signals and generates an output voltage based on a voltage difference between the input signals. Ideally, the output voltage of a differential amplifier is a multiple of a voltage difference ("differential voltage") between the input signals, where the multiple depends on a gain of the differential amplifier. The gain of a differential amplifier depends on the function of the differential amplifier in the circuit in which it is employed. Internal components of the differential amplifier are expected to have certain performance characteristics but variations in manufacturing processes for fabricating such components can vary, which in turn causes variations in component characteristics. As an example, an offset voltage is an inaccuracy in the amplifier output created by a variation in performance characteristics of internal components. Offset voltage is visible as a non-zero output voltage when the voltage difference between the amplifier input signals is zero. Thus, in a differential amplifier having an offset voltage $V_{OFFSET}$, a gain G, a first input $V_1$, and a second input $V_2$, an output voltage $V_{OUT}$ of the amplifier is equal to $G \cdot (V_1 - V_2 + V_{OFFSET})$. The offset voltage $V_{OFFSET}$ can be a positive or negative voltage. In a multi-stage differential amplifier, the offset voltage $V_{OFFSET}$ is an accumulation of offset voltages of the respective stages. In circuits in which a high degree of accuracy is required in the output voltage, it is beneficial to detect and compensate for offset voltage.

SUMMARY

Exemplary aspects disclosed herein include an offset compensated differential amplifier and calibration circuit providing increased linear range and granularity of offset compensation. A method of offset compensation calibration in an offset compensated differential amplifier is also disclosed. A compensation calibration circuit for calibrating an offset compensation voltage in a differential amplifier employs a successive approximation register (SAR) analog-to-digital converter (ADC) to generate a binary value based on an output voltage of the differential amplifier in an offset compensation calibration mode. The compensation calibration circuit employs a digital-to-analog converter (DAC) to generate a compensation control voltage based on the binary value. In an exemplary aspect, an offset compensated differential amplifier employs a multi-tan h circuit comprising a plurality of differential pairs coupled in parallel to compensate for an offset voltage of the output voltage in the offset compensation calibration mode.

The plurality of differential pairs each include a compensation transistor coupled to the positive internal node and a reference transistor coupled to the negative internal node. Each compensation transistor receives the compensation control voltage and each reference transistor receives one of a plurality of different reference voltages. The multi-tan h circuit generates an offset compensation voltage on the positive and negative internal nodes based on a difference between the compensation control voltage and the plurality of different reference voltages. In each of the plurality of differential pairs, a current transfer function of current in response to voltage is a hyperbolic tangent (tan h) function with a short range of linearity. However, a summation of the current responses of the plurality of differential pairs is linear over a larger voltage range than the current responses of a single one of the plurality of differential pairs. The summation also has a lower rate of change in the linear voltage range than any one of the plurality of differential pairs. Thus, the offset compensated differential amplifier provides offset compensation with improved linearity and a finer granularity compared to a conventional differential amplifier.

In an exemplary embodiment, an offset compensated differential amplifier including a first amplifier stage, a second amplifier stage, and an offset compensation circuit is disclosed. The first amplifier stage is configured to generate a first output differential voltage on a positive internal node and a negative internal node based on a primary differential voltage. The second amplifier stage is coupled to the positive internal node and the negative internal node and configured to generate an output voltage based on the intermediate differential voltage on the positive internal node and the negative internal node. The offset compensation circuit comprises a first resister configured to couple to a supply voltage node and to the positive internal node, and a second resistor configured to couple to the supply voltage node and to the negative internal node. The offset compensation circuit also comprises a multi-tan h circuit comprising a plurality of constant current sources and a plurality of differential pairs. Each of the plurality of differential pairs comprises a compensation transistor configured to couple to the positive internal node and to a current input of a corresponding one of the plurality of constant current sources, the compensation transistor comprising a compensation control input configured to receive a compensation control voltage. Each of the plurality of differential pairs also comprises a reference transistor configured to couple to the negative internal node and to the current input of the corresponding one of the plurality of constant current sources, the reference transistor comprising a control input configured to receive one of a plurality of different reference voltages, wherein the plurality of differential pairs supplies an offset compensation voltage to the positive and negative internal nodes based on the compensation control voltage and the plurality of different reference voltages and the intermediate differential voltage is based on the first output differential voltage and the offset compensation voltage.

In another exemplary embodiment, an offset compensated differential amplifier system comprising an offset compensated differential amplifier and a compensation calibration circuit is disclosed. The offset compensated differential amplifier includes a positive primary input and a negative primary input. The offset compensated differential amplifier comprising a first amplifier stage, a second amplifier stage, and an offset compensation circuit is disclosed. The first amplifier stage is configured to generate a first output differential voltage on a positive internal node and a negative internal node based on a primary differential voltage on the positive and negative primary inputs. The second amplifier stage is coupled to the positive internal node and the negative internal node and configured to generate an output voltage based on the intermediate differential voltage on the positive internal node and the negative internal node. The offset compensation circuit comprises a first resister configured to couple to a supply voltage node and to the positive internal node, and a second resistor configured to couple to the supply voltage node and to the negative internal node. The offset compensation circuit also comprises a multi-tan h circuit comprising a plurality of constant current sources and a plurality of differential pairs. Each of the plurality of differential pairs comprises a compensation transistor configured to couple to the positive internal node and to a current input of a corresponding one of the plurality of constant current sources, the compensation transistor comprising a compensation control input configured to receive a compensation control voltage. Each of the plurality of differential pairs also comprises a reference transistor configured to couple to the negative internal node and to the current input of the corresponding one of the plurality of constant current sources, the reference transistor comprising a control input configured to receive one of a plurality of different reference voltages, wherein the plurality of differential pairs supplies an offset compensation voltage to the positive and negative internal nodes based on the compensation control voltage and the plurality of different reference voltages and the intermediate differential voltage is based on the first output differential voltage and the offset compensation voltage. The compensation calibration circuit comprises a switch configured to electrically short the positive primary input to the negative primary input in response to an offset compensation calibration mode. The compensation calibration circuit comprises a successive approximation register (SAR) analog-to-digital converter (ADC) coupled to the second amplifier stage and configured to generate a binary value based on the output voltage in response to the offset compensation calibration mode. The compensation calibration circuit comprises a digital-to-analog converter (DAC) configured to generate the compensation control voltage based on the binary value.

In another exemplary aspect, a method of compensating an offset voltage in a differential amplifier is disclosed. The method includes generating, in a successive approximation register (SAR) analog-to-digital converter (ADC), a binary value based on an output voltage of a differential amplifier in an offset compensation calibration mode. The method includes generating, in a digital-to-analog converter (DAC), a compensation control voltage in a range from a lower reference voltage to a higher reference voltage based on the binary value. The method includes coupling a first resistor to a supply voltage node and a positive internal node between a first amplifier stage and a second amplifier stage of the differential amplifier. The method includes coupling a second resistor to the supply voltage node and a negative internal node between the first amplifier stage and the second amplifier stage of the differential amplifier, the positive and negative internal nodes comprising an intermediate differential voltage. The method includes coupling a plurality of differential pairs to the positive and negative internal nodes. The method of coupling each one of the plurality of differential pairs includes coupling a reference transistor to the negative internal node and a constant current source, receiving, on a control input of the reference transistor, one of a plurality of different reference voltages from the lower reference voltage to the higher reference voltage. The method includes coupling a compensation transistor to the positive internal node and the constant current source and receiving, on a control input of the compensation transistor, the compensation control voltage generated in the DAC. The method includes providing, by the plurality of differential amplifiers, an offset compensation voltage to the positive and negative internal nodes based on the output voltage of the differential amplifier in response to the offset compensation calibration mode.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
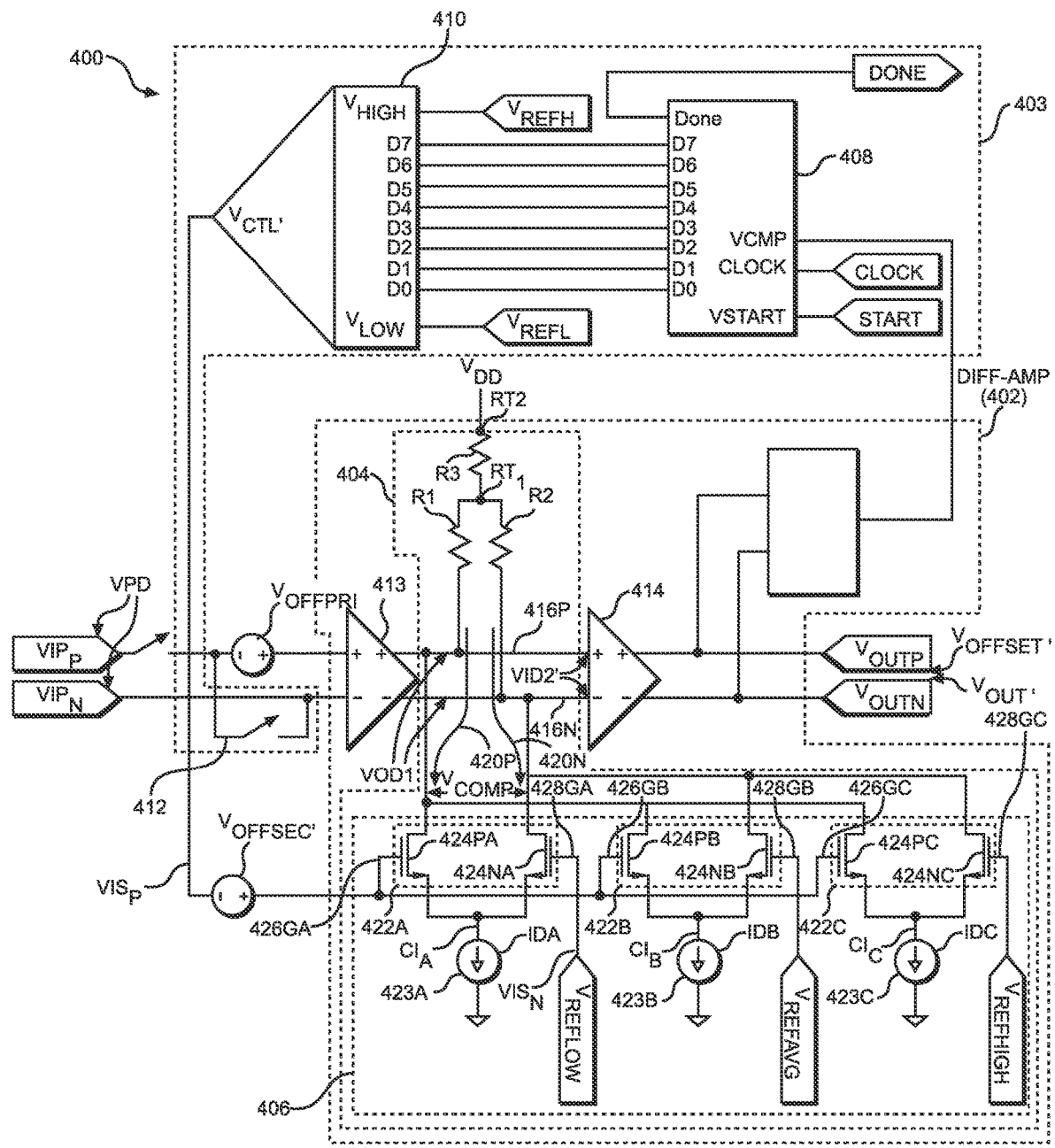
FIG. 4 is a schematic diagram of an exemplary offset compensated differential amplifier system including a compensation calibration circuit and an offset compensated differential amplifier employing an offset compensation circuit including a multi-tan h circuit to provide offset voltage compensation with increased linear range and finer granularity than the system of FIG. 1.
Figure 7:
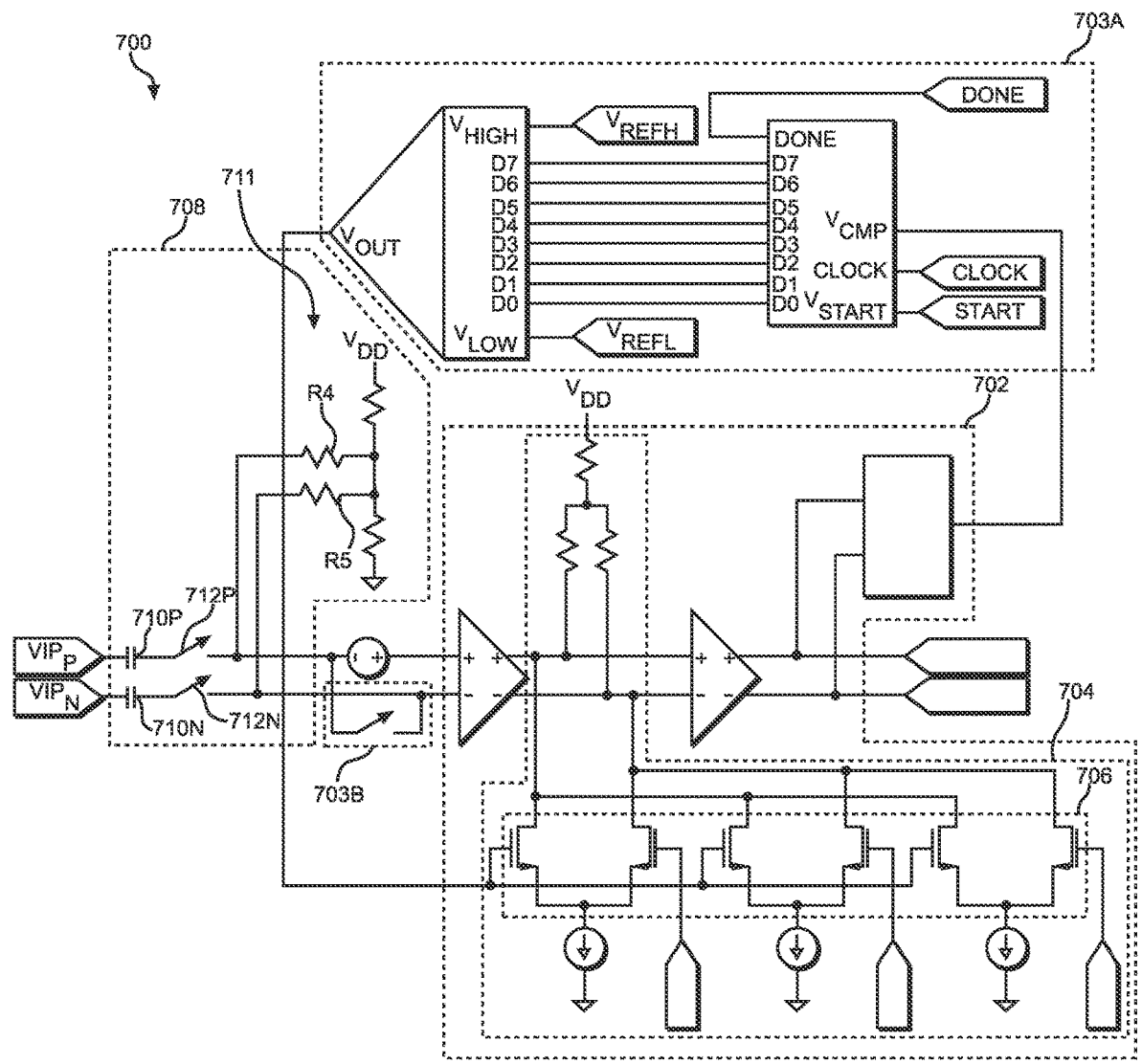
Figure 8:
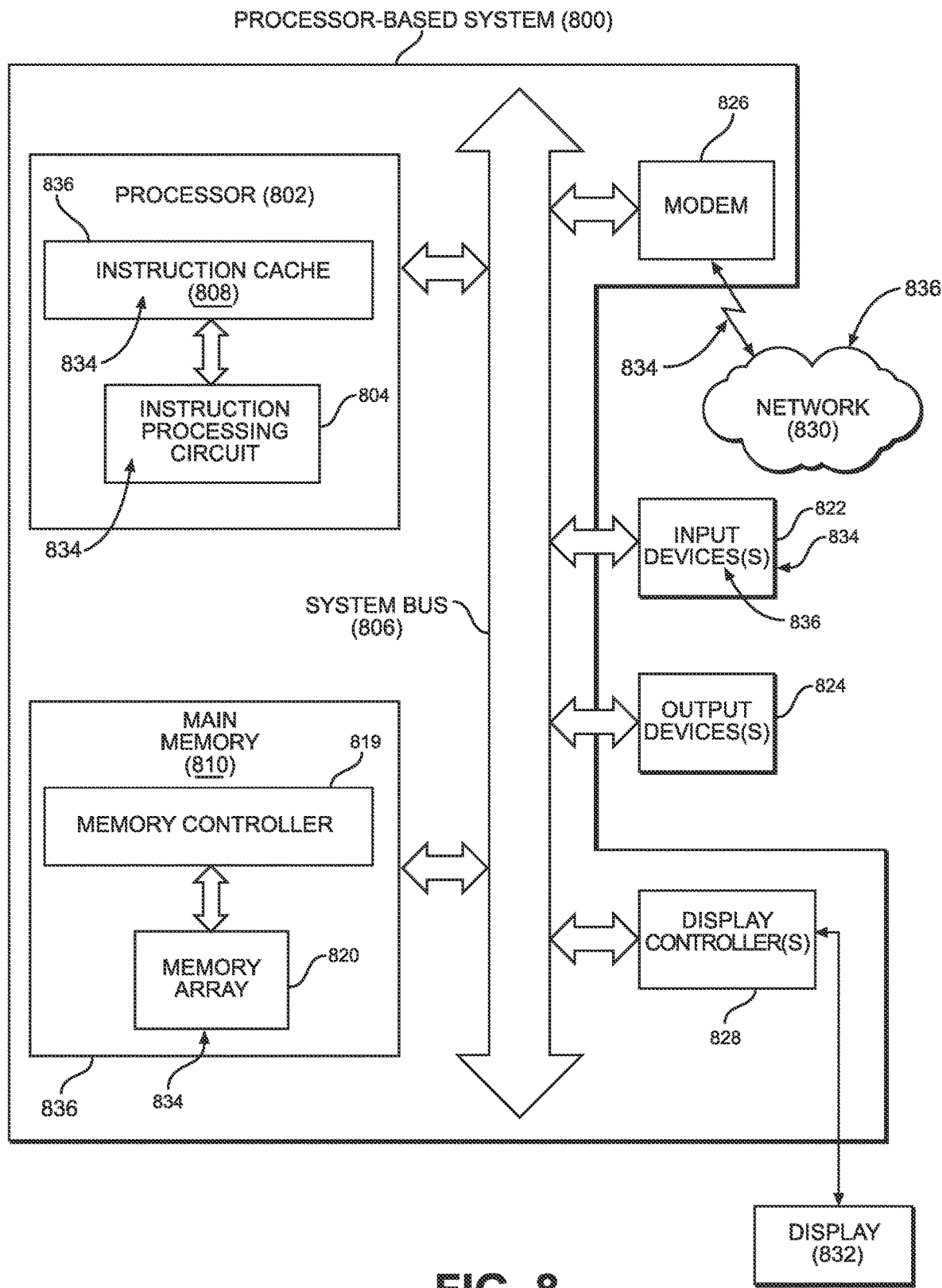

FIG. 7 is a schematic diagram of the exemplary offset compensated differential amplifier system of FIG. 4 including coupling capacitors and common mode voltage control; and FIG. 8 is a block diagram of an exemplary processor-based system including a plurality of devices coupled to a system bus and any of such devices may include an offset compensated differential amplifier as shown in FIG. 4 including an offset compensation circuit employing a multi-tan h circuit for increased linear range and finer granularity compensation of a cumulative offset voltage.

DETAILED DESCRIPTION

Exemplary aspects disclosed herein include an offset compensated differential amplifier and calibration circuit providing increased linear range and granularity of offset compensation. A method of offset compensation calibration in an offset compensated differential amplifier is also disclosed. A compensation calibration circuit for calibrating an offset compensation voltage in a differential amplifier employs a successive approximation register (SAR) analog-to-digital converter (ADC) to generate a binary value based on an output voltage of the differential amplifier in an offset compensation calibration mode. The compensation calibration circuit employs a digital-to-analog converter (DAC) to generate a compensation control voltage based on the binary value. In an exemplary aspect, an offset compensated differential amplifier employs a multi-tan h circuit comprising a plurality of differential pairs coupled in parallel to compensate for an offset voltage of the output voltage in the offset compensation calibration mode.

The plurality of differential pairs each include a compensation transistor coupled to the positive internal node and a reference transistor coupled to the negative internal node. Each compensation transistor receives the compensation control voltage and each reference transistor receives one of a plurality of different reference voltages. The multi-tan h circuit generates an offset compensation voltage on the positive and negative internal nodes based on a difference between the compensation control voltage and the plurality of different reference voltages. In each of the plurality of differential pairs, a current transfer function of current in response to voltage is a hyperbolic tangent (tan h) function with a short range of linearity. However, a summation of the current responses of the plurality of differential pairs is linear over a larger voltage range than the current responses of a single one of the plurality of differential pairs. The summation also has a lower rate of change in the linear voltage range than any one of the plurality of differential pairs. Thus, the offset compensated differential amplifier provides offset compensation with improved linearity and a finer granularity compared to a conventional differential amplifier.

Figure 1:
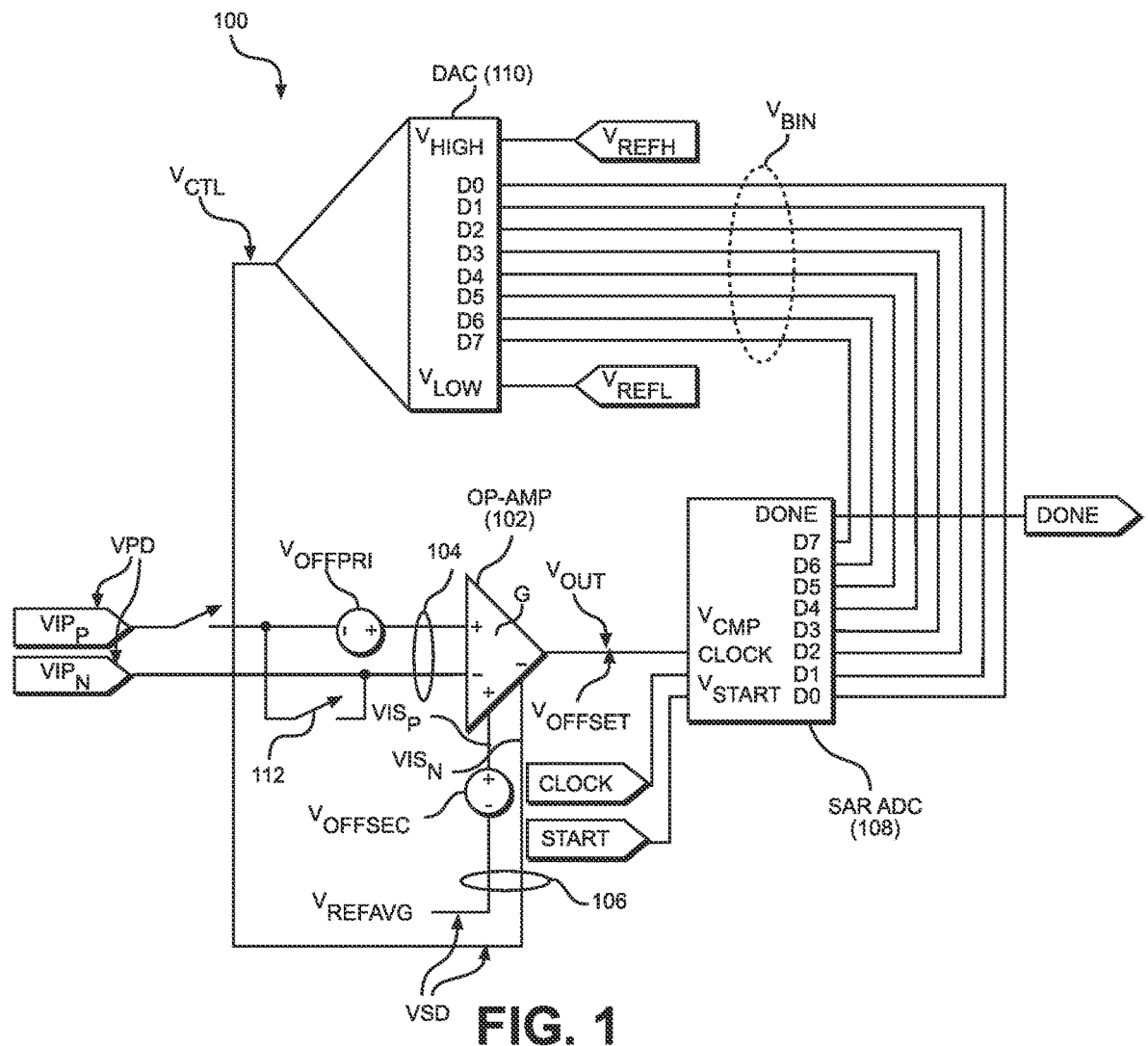
FIG. 1 is a schematic diagram of a conventional automatically calibrating operational amplifier system for mitigating offset voltages.

FIG. 1 illustrates an automatically calibrating operational amplifier (op-amp) system 100 configured to compensate an op-amp output voltage $V_{OUT}$ generated by an op-amp 102 for the purpose of mitigating effects of an offset voltage $V_{OFFSET}$ of the op-amp 102. The offset voltage $V_{OFFSET}$ is an offset (e.g., consistent shift in one direction) that can be caused by variations of internal components of the op-amp 102 due to manufacturing process variations. These variations result in the op-amp output voltage $V_{OUT}$ being positively or negatively offset. An example of the offset voltage $V_{OFFSET}$ is the op-amp output voltage $V_{OUT}$ being non-zero when the input voltage to the op-amp 102 is 0 volts.

The op-amp 102 includes primary differential inputs 104 receiving a positive primary input voltage $VIP_P$ and a negative primary input voltage $VIP_N$. A primary differential voltage VPD (=$VIP_P$–$VIP_N$) is received on the primary differential inputs 104 for amplification by the op-amp 102. FIG. 1 shows a discrete offset voltage source, offset voltage $V_{OFFPRI}$, on the positive primary input voltage $VIP_P$ of the primary differential inputs 104. If the primary differential inputs 104 were the only inputs to the op-amp 102, the op-amp output voltage $V_{OUT}$ would be equal to G·(VPD+$V_{OFFPRI}$) or G·($VIP_P$–$VIP_N$+$V_{OFFPRI}$), where G is a gain of the op-amp 102. Thus, the offset voltage $V_{OFFPRI}$ and the primary differential voltage VPD are both amplified by the gain G.

To increase accuracy of the op-amp output voltage $V_{OUT}$, a means for mitigating the offset voltage $V_{OFFPRI}$ is needed. In this regard, the op-amp 102 also includes secondary differential inputs 106 including a positive secondary input voltage $VIS_P$ and negative secondary input voltage $VIS_N$. A secondary differential voltage VSD is received on the secondary differential inputs 106 to compensate for the offset voltage $V_{OFFPRI}$. However, there may also be an offset voltage $V_{OFFSEC}$ at the secondary differential inputs 106. FIG. 1 shows the offset voltage $V_{OFFSEC}$ as a discrete source on the positive secondary input voltage $VIS_P$. Consequently, the op-amp output voltage $V_{OUT}$ is determined by: $G_A$·(VPD+$V_{OFFPRI}$)+$G_B$·(VSD+$V_{OFFSEC}$), where $G_A$ is a gain relative to the primary differential inputs 104 and $G_B$ is a gain relative to the secondary differential inputs 106. From this equation, it is seen that the secondary differential voltage VSD can be adjusted to compensate for an offset voltage $V_{OFFSET}$, which includes effects of both the offset voltage $V_{OFFPRI}$ at the primary differential inputs 104 and the offset voltage $V_{OFFSEC}$ at the secondary differential inputs 106. The op-amp output voltage $V_{OUT}$ can be made more accurate (e.g., closer to $G_A$·VPD) by supplying an appropriate secondary differential voltage VSD as a difference between the positive secondary input voltage $VIS_P$ and the negative secondary input voltage $VIS_N$.

There is a range of variation of the offset voltage $V_{OFFSET}$ based on manufacturing process variation and a corresponding range of the secondary differential voltage VSD needed for compensation. The automatically calibrating op-amp system 100 compensating for the offset voltage $V_{OFFSET}$ may include supplying the positive secondary input voltage $VIS_P$ as a constant value and supplying the negative secondary input voltage $VIS_N$ in a range between a lower reference voltage $V_{REFL}$ and a higher reference voltage $V_{REFH}$ to achieve the desired range of the secondary differential voltage VSD. Midway between the lower reference voltage $V_{REFL}$ and the higher reference voltage $V_{REFH}$ is an average reference voltage $V_{REFAVG}$ (i.e., ($V_{REFH}$–$V_{REFL}$)/2) employed as the constant value supplied to positive secondary input voltage $VIS_P$. Thus, the secondary differential voltage VSD can range between $V_{REFL}$–$V_{REFAVG}$ and $V_{REFH}$–$V_{REFAVG}$. The lower reference voltage $V_{REFL}$ and the higher reference voltage $V_{REFH}$ can be set according to the expected process variation.

The automatically calibrating op-amp system 100 includes a successive approximation register (SAR) analog-to-digital converter (ADC) circuit (referred to herein as "SAR ADC") 108 and a digital-to-analog converter (DAC) 110 to automatically calibrate the negative secondary input voltage $VIS_N$ that is needed to compensate the offset voltage $V_{OFFSET}$. Before describing operation of the SAR ADC 108 for generating the negative secondary input voltage $VIS_N$, details of the DAC 110 are first provided. With reference to FIG. 1, the DAC 110 includes an input $V_{HIGH}$ that receives the higher reference voltage $V_{REFH}$ and an input $V_{LOW}$ to receive the lower reference voltage $V_{REFL}$. The DAC 110 also includes digital inputs D0-D7 that receive a binary value $V_{BIN}$ having multiple bits generated by the SAR ADC 108. The DAC 110 generates, based on the digital inputs D0-D7, a compensation control voltage $V_{CTL}$ that is supplied as the negative secondary input voltage $VIS_N$. In this example, the digital inputs D0-D7 indicate the binary value $V_{BIN}$ of eight (8)-bits, where D0 is the most significant bit (MSB) and D7 is the least significant bit (LSB). Although eight (8)-bits D0-D7 are used in the example in FIG. 1, the DAC 110 may operate with any number X+1 of digital inputs D0-DX depending on the offset voltage $V_{OFFSET}$, the desired compensation control voltage $V_{CTL}$, and on noise in the primary differential voltage VPD.

The compensation control voltage $V_{CTL}$ is set to one of $2^8$=256 incremental values in the range from the lower reference voltage $V_{REFL}$ to the higher reference voltage $V_{REFH}$ based on the digital inputs D0-D7. For example, in response to a binary value of "00000000" (i.e., Arabic "0") on the digital inputs D0-D7, the DAC 110 generates a compensation control voltage $V_{CTL}$ equal to the lower reference voltage $V_{REFL}$. In response to a binary value of "11111111" (i.e., Arabic "255") on the digital inputs D0-D7, the DAC 110 generates a compensation control voltage WIT equal to the higher reference voltage $V_{REFH}$. In response to a binary value of "10000000" (i.e., Arabic "128") on the digital inputs D0-D7, the DAC 110 generates a compensation control voltage $V_{CTL}$ approximately equal to the average reference voltage $V_{REFAVG}$.

With continuing reference to FIG. 1, the SAR ADC 108 includes an input $V_{CMP}$ that receives the op-amp output voltage $V_{OUT}$ which is based on a comparison of the primary differential inputs 104. The SAR ADC 108 also includes a CLOCK input for receiving a CLOCK signal, and a $V_{START}$ input that receives a START signal. The SAR ADC 108 generates a binary value $V_{BIN}$ that is supplied to the digital inputs D0-D7 of the DAC 110. The SAR ADC 108 also includes a DONE output that generates a DONE signal indicating that the process of the SAR ADC 108 for converting the op-amp output voltage $V_{OUT}$ to the binary value $V_{BIN}$ to compensate for the offset voltage $V_{OFFSET}$ is complete.

As noted above, the op-amp 102 generates the op-amp output voltage $V_{OUT}=G_A \cdot (VPD+V_{OFFPRI})+G_B \cdot (VSD+V_{OFFSEC})$. A switch 112 electrically shorts the primary differential inputs 104, bringing the primary differential voltage VPD to 0 volts for a calibration mode. The switch 112 may be activated, for example, by the START signal to the SAR ADC 108. In this mode, the op-amp output voltage $V_{OUT}=(G_A \cdot V_{OFFPRI})+G_B \cdot (VSD+V_{OFFSEC})$. Thus, while VPD=0, the op-amp output voltage $V_{OUT}$ is based only on the secondary differential voltage VSD and the cumulative effects of the offset voltages $V_{OFFPRI}$ and $V_{OFFSEC}$ (i.e., the offset voltage $V_{OFFSET}$). In this regard, the secondary differential voltage VSD required to compensate the offset voltage $V_{OFFSET}$ can be calibrated from the op-amp output voltage $V_{OUT}$ during the offset compensation calibration mode.

Calibrating the secondary differential voltage VSD includes setting the compensation control voltage $V_{CTL}$, which in turn includes adjusting the binary value $V_{BIN}$ provided to the DAC 110 by the SAR ADC 108. In response to the START signal, the SAR ADC 108 calibrates the binary value $V_{BIN}$ for compensating the offset voltage $V_{OFFSET}$ at a rate of one bit per cycle of the CLOCK signal in a plurality of successive cycles of the CLOCK signal.

Calibration begins without any offset voltage compensation in a first cycle of the CLOCK signal following activation of the START signal. In this regard, the SAR ADC 108 generates a binary value $V_{BIN}$ to set the secondary differential voltage VSD to 0 volts. As understood in view of the equations above, when the secondary differential voltage VSD=0 volts (and primary differential voltage VPD=0), the op-amp output voltage $V_{OUT}$ is determined by only the offset voltage $V_{OFFSET}$. Setting the secondary differential voltage VSD to 0 volts includes setting the negative secondary input voltage $VIS_N$ to the average reference voltage $V_{REFAVG}$ because the positive secondary input voltage $VIS_P$ was previously set to the average reference voltage $V_{REFAVG}$. Setting the negative secondary input voltage $VIS_N$ to the average reference voltage $V_{REFAVG}$ (via the compensation control voltage $V_{CTL}$ of the DAC 110) includes the SAR ADC 108 setting the binary value $V_{BIN}$ to "10000000" (i.e., Arabic "128"). The binary value $V_{BIN}$ of "10000000" is a mid-point in the range of values of the binary value $V_{BIN}$ and, thus, will cause the DAC 110 to generate a compensation control voltage $V_{CTL}$ midway between the lower reference voltage $V_{REFL}$ and the higher reference voltage $V_{REFH}$ (i.e., at the average reference voltage $V_{REFAVG}$).

For purposes of explanation, calibration of the automatically calibrating op-amp system 100 will be further described with reference to an example in which the higher reference voltage $V_{REFH}$, corresponding to a binary value $V_{BIN}$ of "11111111", is +12.8 millivolts (mV), and the lower reference voltage $V_{REFL}$, corresponding to a binary value $V_{BIN}$ of "00000000", is –12.8 millivolts (mV). Therefore, in this example, the average reference voltage $V_{REFAVG}$, corresponding to a binary value $V_{BIN}$ of "10000000", is approximately 0 volts and each incremental increase in the binary value $V_{BIN}$ corresponds to an increase of 0.1 mV in the compensation control voltage $V_{CTL}$. In addition, it is assumed that the secondary differential voltage VSD needs to be +4.5 mV to compensate for the offset voltage $V_{OFFSET}$ in this example.

In the first cycle after the START signal, according to the example, the SAR ADC 108 compares the op-amp output voltage $V_{OUT}$ to 0 volts, which is the expected value of the op-amp output voltage $V_{OUT}$ when the primary differential voltage VPD and the secondary differential voltage VSD are both set to 0 volts. This comparison is used to determine whether the offset voltage $V_{OFFSET}$, in the absence of any compensation, is positive or negative. If the SAR ADC 108 determines the op-amp output voltage $V_{OUT}$ is less than 0 volts, the SAR ADC 108 keeps the first digital input D0 at a "1" because a positive compensation control voltage $V_{CTL}$ is needed. Otherwise, the first digital input D0 is set to "0". In this example, as previously stated, the secondary differential voltage VSD needs to be 4.5 mV to compensate for the offset voltage $V_{OFFSET}$ being negative (less than 0 volts). Therefore, the first digital input D0 will remain at "1".

In the second cycle of the CLOCK signal after the START signal, the SAR ADC 108 sets the next digital input, D1, to "1", such that the binary value $V_{BIN}$="11000000". In response, the DAC 110 generates a compensation control voltage $V_{CTL}$ midway between the average reference voltage $V_{REFAVG}$ and the higher reference voltage $V_{REFH}$ (i.e., approximately +6.4 mV). With 6.4 mV supplied to the negative secondary input voltage $VIS_N$ and the average reference voltage $V_{REFAVG}$ of 0 volts supplied to the positive secondary input voltage $VIS_P$, the secondary differential voltage VSD=+6.4 mV. The SAR ADC 108 again compares the op-amp output voltage $V_{OUT}$ to 0 volts to determine whether the offset voltage $V_{OFFSET}$ is compensated. In this case, the secondary differential voltage VSD of 6.4 mV is more than is needed to compensate for the negative offset voltage $V_{OFFSET}$. As a result, the SAR ADC 108 determines that the op-amp output voltage $V_{OUT}$ is greater than 0 volts and the digital input D1 is reset and will remain at "0".

In the third cycle of the CLOCK signal after the START signal, the SAR ADC 108 sets the next digital input, D2, to "1", such that the binary value $V_{BIN}$="10100000". In response, the DAC 110 generates a compensation control voltage of approximately +3.2 mV and the SAR ADC 108 again compares the op-amp output voltage $V_{OUT}$ to 0 volts to determine whether the offset voltage $V_{OFFSET}$ is compensated. In this case, the secondary differential voltage VSD of 3.2 mV is not enough to compensate for the negative offset voltage $V_{OFFSET}$. As a result, the SAR ADC 108 determines that the op-amp output voltage $V_{OUT}$ is less than 0 volts and the digital input D2 will remain at "1".

In the fourth cycle of the CLOCK signal after the START signal, the SAR ADC 108 sets the next digital input, D3, to "1", such that the binary value $V_{BIN}$="10110000". In response, the DAC 110 generates a compensation control voltage of approximately +4.8 mV and the SAR ADC 108 again compares the op-amp output voltage $V_{OUT}$ to 0 volts to determine whether the offset voltage $V_{OFFSET}$ is compensated. In this case, the secondary differential voltage VSD of 4.8 mV is more than is needed to compensate for the negative offset voltage $V_{OFFSET}$. As a result, the SAR ADC 108 determines that the op-amp output voltage $V_{OUT}$ is greater than 0 volts and the digital input D3 is reset and will remain at "0".

In the fifth cycle of the CLOCK signal after the START signal, the SAR ADC 108 sets the next digital input, D4, to "1", such that the binary value $V_{BIN}$="10101000". In response, the DAC 110 generates a compensation control voltage of approximately +4.0 mV and the SAR ADC 108 again compares the op-amp output voltage $V_{OUT}$ to 0 volts to determine whether the offset voltage $V_{OFFSET}$ is compensated. In this case, the secondary differential voltage VSD of 3.2 mV is not enough to compensate for the negative offset voltage $V_{OFFSET}$. As a result, the SAR ADC 108 determines that the op-amp output voltage $V_{OUT}$ is less than 0 volts and the digital input D4 will remain at "1".

In the sixth cycle of the CLOCK signal after the START signal, the SAR ADC 108 sets the next digital input, D5, to "1", such that the binary value $V_{BIN}$="10101100". In response, the DAC 110 generates a compensation control voltage of approximately +4.4 mV and the SAR ADC 108 again compares the op-amp output voltage $V_{OUT}$ to 0 volts to determine whether the offset voltage $V_{OFFSET}$ is compensated. In this case, the secondary differential voltage VSD of 4.4 mV is not enough to compensate for the negative offset voltage $V_{OFFSET}$. As a result, the SAR ADC 108 determines that the op-amp output voltage $V_{OUT}$ is less than 0 volts and the digital input D5 will remain at "1".

In the seventh cycle of the CLOCK signal after the START signal, the SAR ADC 108 sets the next digital input, D6, to "1", such that the binary value $V_{BIN}$="10101110". In response, the DAC 110 generates a compensation control voltage of approximately +4.6 mV and the SAR ADC 108 again compares the op-amp output voltage $V_{OUT}$ to 0 volts to determine whether the offset voltage $V_{OFFSET}$ is compensated. In this case, the secondary differential voltage VSD of 4.6 mV is more than is needed to compensate for the negative offset voltage $V_{OFFSET}$. As a result, the SAR ADC 108 determines that the op-amp output voltage $V_{OUT}$ is greater than 0 volts and the digital input D6 is reset and will remain at "0".

In the eighth cycle of the CLOCK signal after the START signal (the final calibration cycle), the SAR ADC 108 sets the next digital input, D7, to "1", such that the binary value $V_{BIN}$="10101101". In response, the DAC 110 generates a compensation control voltage of approximately +4.5 mV and the SAR ADC 108 again compares the op-amp output voltage $V_{OUT}$ to 0 volts to determine whether the offset voltage $V_{OFFSET}$ is compensated. In this case, the secondary differential voltage VSD of 4.5 mV is the correct amount needed to compensate for the negative offset voltage $V_{OFFSET}$. As a result, the SAR ADC 108 determines that the op-amp output voltage $V_{OUT}$ is not less than 0 volts and the digital input D7 will remain at "1". The SAR ADC 108 also includes a DONE output that generates a DONE signal indicating that the process of the SAR ADC 108 for converting the op-amp output voltage $V_{OUT}$ to the binary value $V_{BIN}$ to compensate for the offset voltage $V_{OFFSET}$ is complete. In other words, the offset compensation calibration mode begins with the START signal and ends with the DONE signal.

A more detailed discussion of the internal features of the SAR ADC 108 and the DAC 110 are beyond the scope of this disclosure and are not provided. However, a more detailed description of the op-amp 102 is presented with reference to the illustration of the automatically calibrating op-amp system 100 in FIG. 2. The op-amp 102 includes a first amplifier stage 202 that receives the primary differential voltage VPD on the primary differential inputs 104. The offset voltage $V_{OFFPRI}$ is a discrete voltage source on the positive primary input voltage $VIP_P$ of the first amplifier stage 202. The first amplifier stage 202 generates an output differential voltage VOD1 on a positive internal node 204P and a negative internal node 204N, which are collectively referred to herein as internal differential node 206. The output differential voltage VOD1 generated by the first amplifier stage 202 on the internal differential node 206 is based on G1·(VPD+$V_{OFFPRI}$) where G1 is a gain of the first amplifier stage 202.

The op-amp 102 includes a differential pair 208 including a compensation transistor 210P coupled to the positive internal node 204P and a reference transistor 210N coupled to the negative internal node 204N. The compensation transistor 210P and the reference transistor 210N are both coupled to a constant current source 212 providing a constant current $I_{212}$. The positive secondary input voltage $VIS_P$ and the negative secondary input voltage $VIS_N$ are coupled to and control the gates 214PG and 214NG, respectively, of the compensation transistor 210P and the reference transistor 210N. As noted above, the offset voltage $V_{OFFSEC}$ is a discrete voltage source on the positive secondary input voltage $VIS_P$. The op-amp 102 also includes resistors R1, R2 and R3 coupled to $V_{DD}$ to establish common mode voltages of the positive and negative internal nodes 204P and 204N and to provide separate current paths 216P and 216N to the compensation transistor 210P and the reference transistor 210N to the differential pair 208.

Figure 2:
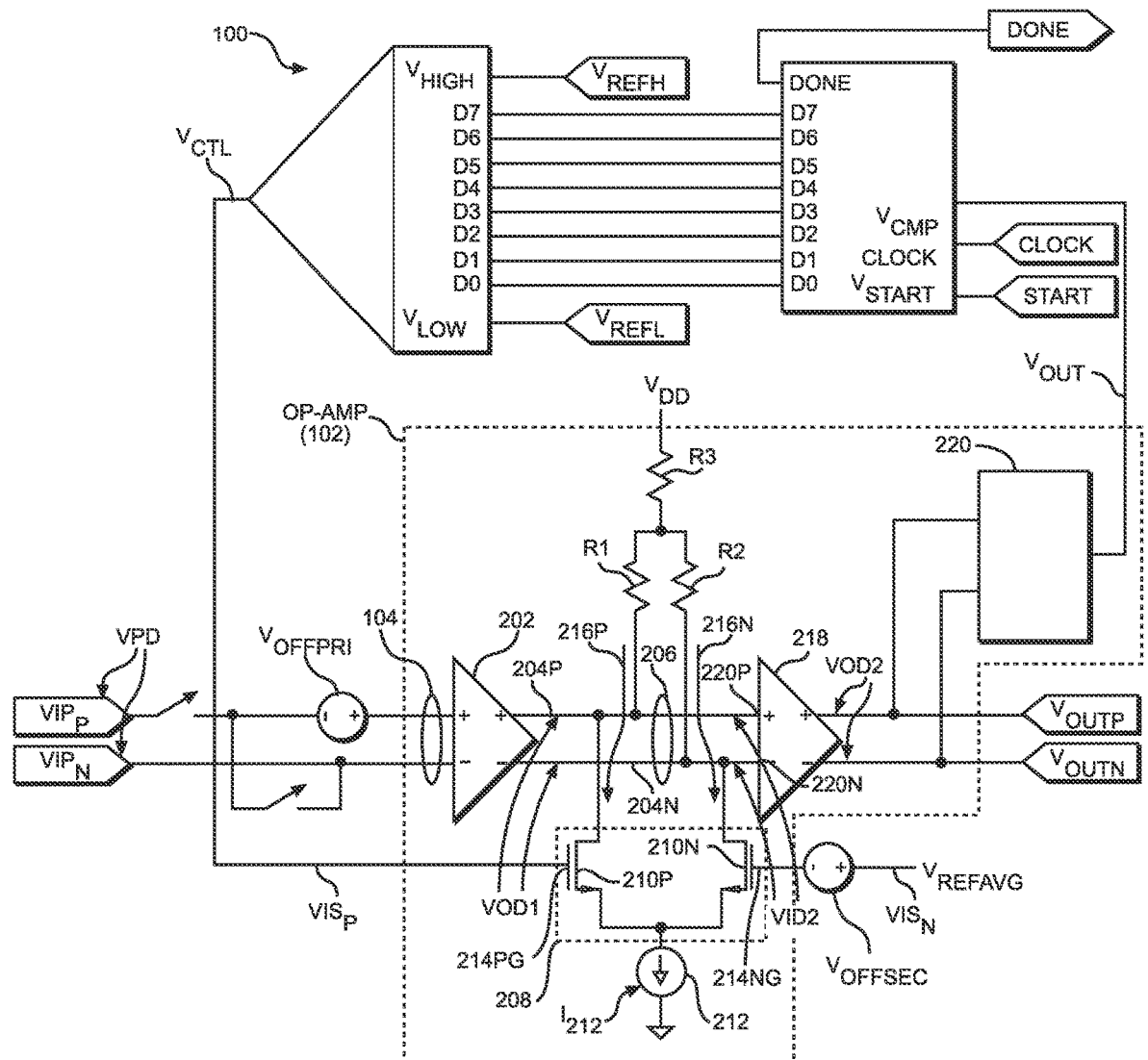
FIG. 2 is a schematic diagram providing a more detailed illustration of the automatically calibrating operational amplifier system in FIG. 1.

With continued reference to FIG. 2, the op-amp 102 also includes a second amplifier stage 218 including inputs 220P and 220N coupled to the positive and negative internal nodes 204P and 204N, respectively. The second amplifier stage 218 generates an output differential voltage VOD2 based on an intermediate differential voltage VID2 on the inputs 220P and 220N. The output differential voltage VOD2=G2·VID2, where G2 is a gain of the second amplifier stage 218. The op-amp 102 also includes a differential to single-ended voltage converter 220 to convert the output differential voltage VOD2 to the op-amp output voltage $V_{OUT}$. The output differential voltage VOD2 is also available on positive output voltage $V_{OUTP}$ and negative output voltage $V_{OUTN}$ for connection to an external circuit, not shown.

Each of the output differential voltage VOD1, the resistors R1, R2, R3, and the differential pair 208 contribute to the intermediate differential voltage VID2 on the internal differential node 206. In the calibration mode, the output differential voltage VOD1=G1·$V_{OFFPRI}$ because the primary differential voltage VPD is set to 0 volts. The differential pair 208 is controlled by the secondary differential voltage VSD. The average reference voltage $V_{REFAVG}$ and the offset voltage $V_{OFFSEC}$ are constant voltages supplied to the gate 214NG of the reference transistor 210N. Thus, compensation for the offset voltage $V_{OFFSET}$ in the op-amp output voltage $V_{OUT}$ is provided by the compensation control voltage Wm supplied to the gate 214PG of the compensation transistor 210P.

Figure 3:
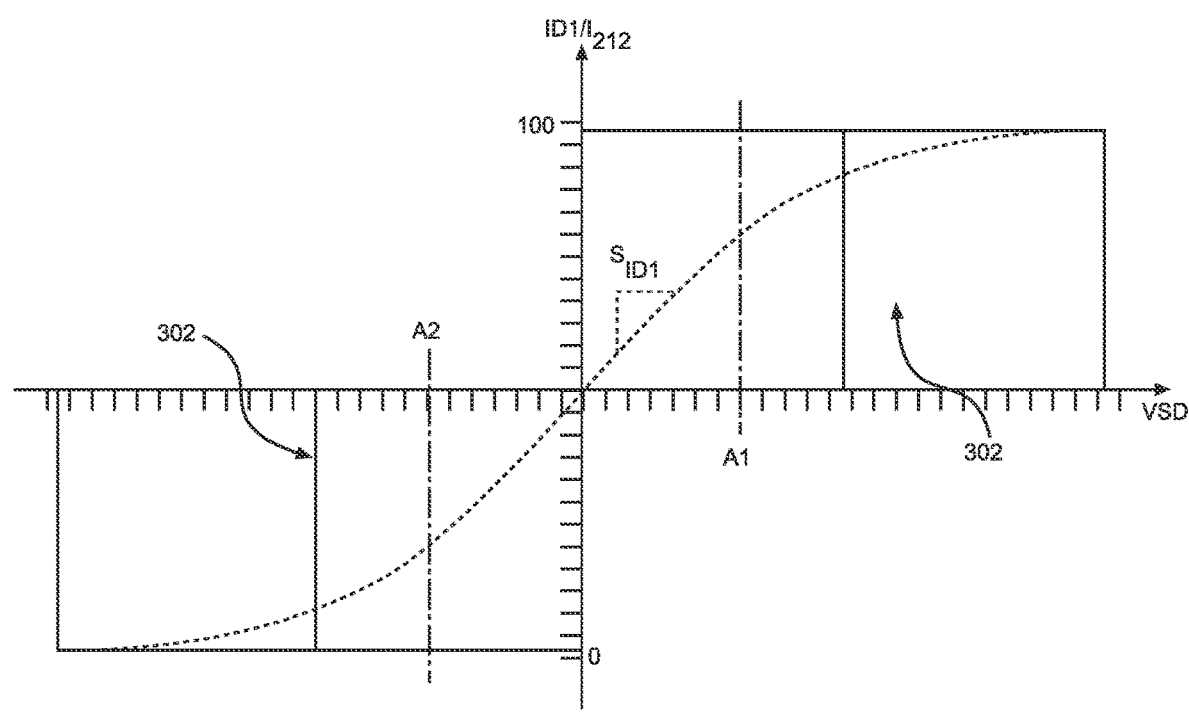
FIG. 3 is a graphic diagram of a voltage to current transfer function of a differential pair over a voltage range supplied to the gates of the transistors in the differential pair.

FIG. 3 is a graphic diagram illustrating a current ID1 through the compensation transistor 210P in FIG. 2 as a percentage of the constant current $I_{212}$ in the constant current source 212 over a range of the secondary differential voltage VSD. That is, the constant current $I_{212}$ comprises the current ID1 through the compensation transistor 210P and the current ID2 through the reference transistor 210N. A percentage of the constant current $I_{212}$ provided by the current ID1 depends on a polarity and magnitude of a difference between the compensation control voltage $V_{CTL}$ supplied to the gate 214PG and the average reference voltage $V_{REFAVG}$ supplied to the gate 214NG. Depending on whether the current ID1 or the current ID2 provides a larger percentage of the constant current $I_{212}$, the differential pair 208 applies an offset compensation to adjust the output differential voltage VOD1 to compensate for the offset voltage $V_{OFFSET}$.

The graph in FIG. 3 shows that when the secondary differential voltage VSD is a positive or negative value near 0 volts, a rate of change in current ID1 is linear, indicating linear transconductance. In particular, between points A1 and A2, the graph of current ID1 is approximately a straight line with a slope $S_{ID1}$. However, in non-linear regions 302 including voltages higher than point A1 and lower than point A2, the linearity of ID1 decreases. Non-linearity is indicated where the graph of current ID1 is no longer a straight line, which means that an amount of change in compensation provided to the op-amp output voltage $V_{OUT}$ for an amount of change in the secondary differential voltage VSD is not constant. Non-linearity with regard to the effects of the compensation control voltage $V_{CTL}$ reduces accuracy of the offset voltage compensation. Thus, a larger range of linearity for compensating the offset voltage is preferred. The automatically calibrating op-amp system 100 in FIGS. 1 and 2 is limited with regard to the range of linearity to the range of the secondary differential voltage VSD corresponding to points A1 and A2.

Another significant aspect of the graphic diagram of ID1 is the slope $S_{ID1}$ in the linear range between points A1 and A2. The slope $S_{ID1}$ indicates a degree of granularity of the compensation provided to the op-amp output voltage $V_{OUT}$. That is, for each incremental change in the compensation control voltage $V_{CTL}$ there is a certain amount of change in the current ID1, which produces a certain amount of change in the op-amp output voltage $V_{OUT}$. A finer granularity makes it possible to compensate the op-amp output voltage $V_{OUT}$ for the offset voltage $V_{OFFSET}$ with greater precision, to increase the accuracy of the op-amp 102. The automatically calibrating op-amp system 100 in FIGS. 1 and 2 is also limited in regard to the slope of a voltage to current transfer function of the differential pair 208 because it would be preferable to provide offset voltage compensation in the op-amp 102 with a finer degree of granularity than is available in the automatically calibrating op-amp system 100.

FIG. 4 is a schematic diagram of an exemplary offset compensated differential amplifier system 400 including an offset compensated differential amplifier ("diff-amp") 402 and a compensation calibration circuit 403. The diff-amp 402 includes an offset compensation circuit 404 that employs a multi-tan h circuit 406 to provide offset voltage compensation with increased linear range and finer granularity than the automatically calibrating op-amp system 100 of FIGS. 1 and 2.

The offset compensation circuit 404 includes a SAR ADC 408, a DAC 410, and a switch 412 that include inputs and outputs corresponding to the SAR ADC 108, the DAC 110, and the switch 112, respectively, of the automatically calibrating op-amp system 100 in FIG. 1 and are also similar in all other aspects. In the offset compensated differential amplifier system 400, the SAR ADC 408, the DAC 410, and the switch 412 operate in a calibration mode to calibrate a compensation control voltage $V_{CTL}'$ to compensate a offset voltage $V_{OFFSET}'$ included in a diff-amp output voltage $V_{OUT}'$ n FIG. 4. The diff-amp output voltage $V_{OUT}'$ is a voltage difference between a positive output voltage $V_{OUTP}$ and a negative output voltage $V_{OUTN}$. The offset voltage $V_{OFFSET}'$ is seen as a non-zero voltage differential between the positive output voltage $V_{OUTP}$ and a negative output voltage $V_{OUTN}$ in response to the primary differential voltage VPD being zero. Due to differences between the offset compensated differential amplifier system 400 in FIG. 4 and the automatically calibrating operational amplifier (op-amp) system 100 in FIGS. 1 and 2, the compensation control voltage $V_{CTL}'$, the offset voltage $V_{OFFSET}'$, and the diff-amp output voltage $V_{OUT}'$ in FIG. 4 are different than the compensation control voltage $V_{CTL}$, the offset voltage $V_{OFFSET}$, and the op-amp output voltage $V_{OUT}$ of FIGS. 1 and 2. The switch 412 electrically shorts the positive primary input $VIP_P$ to the negative primary input voltage $VIP_N$ in response to the offset compensation calibration mode. In this regard, the SAR ADC 408, the DAC 410, and the switch 412 operating in the calibration mode operate according to the descriptions provided above regarding the SAR ADC 108, the DAC 110, and the switch 112 for calibrating the compensation control voltage $V_{CTL}$ in FIG. 1. Thus, no further explanation of the SAR ADC 408, the DAC 410, or the switch 412 are provided herein.

The diff-amp 402 includes a first amplifier stage 413 and a second amplifier stage 414. The diff-amp 402 may be an operational amplifier. A primary differential voltage VPD is supplied to the first amplifier stage 413. Specifically, the first amplifier stage 413 includes a positive primary input voltage $VIP_P$ and a negative primary input voltage $VIP_N$ that receive the primary differential voltage VPD. An offset voltage $V_{OFFPRI}$ between the positive primary input voltage $VIP_P$ and the negative primary input voltage $VIP_N$ is illustrated as a discrete offset voltage $V_{OFFPRI}$. The compensation control voltage $V_{CTL}'$ is adjusted to compensate for the offset voltage $V_{OFFSET}'$ based on the offset voltage $V_{OFFPRI}$ on the positive primary input voltage $VIP_P$ and an offset voltage $V_{OFFSEC}'$ on a positive secondary input voltage $VIS_P$.

The first amplifier stage 413 generates an output differential voltage VOD1 on a positive internal node 416P and a negative internal node 416N based on the primary differential voltage VPD and a first offset voltage $V_{OFFPRI}$. The second amplifier stage 414 is coupled to the positive internal node 416P and the negative internal node 416N generates the diff-amp output voltage $V_{OUT}'$ based on an intermediate differential voltage VID2' on the positive internal node 416P and the negative internal node 416N. The intermediate differential voltage VID2' in FIG. 4 differs from the intermediate differential voltage VID2 in FIG. 2 based on operation of the offset compensation circuit 404. In an exemplary aspect, the offset compensation circuit 404 includes a multi-tan h circuit 406 and resistors R1, R2 and R3 coupled to the positive internal node 416P and the negative internal node 416N. The offset voltage $V_{OFFSEC}'$ is a secondary offset voltage based on the multi-tan h circuit 406. The resistor R1 is coupled to a supply voltage node $V_{DD}$ and to the positive internal node 416P. The resistor R2 is coupled to the supply voltage node $V_{DD}$ and to the negative internal node 416N. The resistors R1 and R2 provide separate current paths 420P and 420N to the multi-tan h circuit 406. Resistors R1 and R2 may have a same resistance. Optionally, the resistors R1, R2 may couple to the supply voltage node $V_{DD}$ by way of resistor R3. The resistor R3 includes a first terminal RT1 coupled to R1 and R2 and a second terminal RT2 coupled to the supply voltage node $V_{DD}$. Together, resistors R1, R2, and R3 establish common mode voltages of the positive and negative internal nodes 416P and 416N.

In an exemplary aspect, the offset compensation circuit 404 including the multi-tan h circuit 406 improves on the op-amp 102 in FIGS. 1 and 2 by providing a more uniform distribution of final calibrated offset voltage compensation in response to the compensation control voltage $V_{CTL}'$ than the op-amp 102 provides in response to the compensation control voltage $V_{CTL}$. The diff-amp 402 replaces the differential pair 208 of FIG. 2, that provides offset compensation to the positive and negative internal nodes 206P and 206N, with the multi-tan h circuit 406 to provide a linear transconductance over a larger range of the compensation control voltage $V_{CTL}$ compared to the differential pair 208 in the op-amp 102 in FIG. 2. In other words, the multi-tan h circuit 406 provides greater linearity or increased uniformity of compensation between changes in the compensation control voltage $V_{CTL}$ and the effective compensation in the diff-amp 402 for the offset voltage $V_{OFFSET}'$. The multi-tank circuit 406 also provides a linear transconductance at a finer granularity than the differential pair 208 in the op-amp 102.

The multi-tan h circuit 406 includes three differential pairs 422A, 422B, and 422C and constant current sources 423A, 423B, and 423C. The constant current sources 423A, 423B, and 423C include respective current inputs $CI_A$, $CI_B$, and $CI_C$. The differential pairs 422A, 422B, and 422C include compensation transistors 424PA, 424PB, and 424PC, respectively, that are each coupled to the positive internal node 416P and to the current inputs $CI_A$, $CI_B$, and $CI_C$ of the constant current sources 423A, 423B, and 423C. The constant current sources 423A, 423B, and 423C conduct currents IDA, IDB, and IDC, which may all be a same first current. The compensation transistors 424PA, 424PB, and 424PC have respective control inputs 426GA, 426GB, and 426GC that each receive the compensation control voltage $V_{CTL}'$. The control inputs 426GA, 426GB, and 426GC are referred to herein as gates 426GA, 426GB, and 426GC. The compensation control voltage $V_{CTL}'$ is in a range from a lower reference voltage $V_{REFL}$ to a higher reference voltage $V_{REFH}$.

The differential pairs 422A, 422B, and 422C also include reference transistors 424NA, 424NB and 424NC coupled to the negative internal node 416N and to the current inputs $CI_A$, $CI_B$, and $CI_C$ of the constant current sources 423A, 423B, and 423C. The reference transistors 424NA, 424NB, and 424NC have respective control inputs 428GA, 428GB, and 428GC, also referred to herein as gates 428GA, 428GB, and 428GC, and each receives a different reference voltage from a lower reference voltage $V_{REFL}$ to a higher reference voltage $V_{REFH}$. In the example in FIG. 4, for reasons to be explained further below with reference to FIG. 5, the gate 428GB of the second reference transistor 424NB receives an average reference voltage $V_{REFAVG}$, the gate 428GA receives a lower reference voltage $V_{REFLOW}$ than the average reference voltage $V_{REFAVG}$, and the gate 428GC receives a higher reference voltage $V_{REFHIGH}$ than the average reference voltage $V_{REFAVG}$.

The differential pairs 422A, 422B, and 422C supply an offset compensation voltage $V_{COMP}$ to the positive and negative internal nodes 416P and 416N based on the compensation control voltage $V_{CTL}'$ and the reference voltages $V_{REFLOW}$, $V_{REFAVG}'$, and $V_{REFHIGH}$ received on the control inputs 428GA, 428GB, and 428GC of the reference transistors 424NA, 424NB and 424NC. The intermediate differential voltage VID2' is based on the output differential voltage VOD1 and the offset compensation voltage $V_{COMP}$. The offset compensation voltage $V_{COMP}$ reduces an offset in the diff-amp output voltage $V_{OUT}'$ due to the offset voltage $V_{OFFPRI}$ and the offset voltage $V_{OFFSEC}'$.

In the example in FIG. 4, the gate 428GB of the second reference transistor 424NB receives an average reference voltage $V_{REFAVG}$. The average reference voltage $V_{REFAVG}$ is an average of or midway between lower and higher reference voltages $V_{REFL}$ and $V_{REFH}$ that determine a range of the compensation control voltage $V_{CTL}'$ generated in the DAC 410. For reasons to be explained further below with reference to FIG. 5, the gate 428GA receives a lower reference voltage $V_{REFLOW}$ than the average reference voltage $V_{REFAVG}$, and the gate 428GC receives a higher reference voltage $V_{REFHIGH}$ than the average reference voltage $V_{REFAVG}$.

Figure 5:
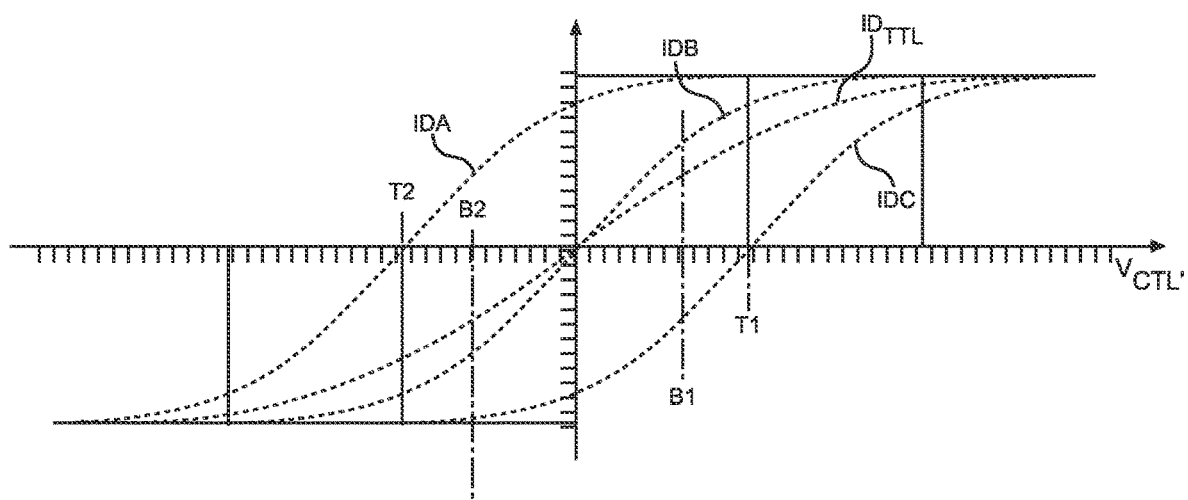
FIG. 5 is a graphic diagram of a voltage to current transfer function of a plurality of differential pairs in a multi-tan h circuit over a voltage range supplied to the gates of the transistors in the differential pairs.

FIG. 5 is a graphic diagram of the transfer functions of the differential pairs 422A, 422B, and 422C in the multi-tan h circuit 406. In particular, FIG. 5 shows currents IDA, IDB, and IDC that flow through the compensation transistors 424PA, 424PB, and 424PC in the differential pairs 422A, 422B, and 422C in response to a compensation control voltage $V_{CTL}'$. The lower reference voltage $V_{REFLOW}$ supplied to the gate 428GA causes the differential pair 422A to begin conducting the current IDA in response to a lower compensation control voltage $V_{CTL}$ (i.e., corresponding to a lower secondary differential voltage VSD) than the differential pair 422B. Similarly, the higher reference voltage $V_{REFHIGH}$ supplied the gate 428GC causes the differential pair 422C to begin conducting the current IDC at a higher compensation control voltage $V_{CTL}$ than the differential pair 422B. When the lower reference voltage $V_{REFL}$ow and the average reference voltage $V_{REFAVG}$ are supplied to the gates 428GA and 428GB, the compensation transistors 424PA and 424PB in the differential pairs 422A and 422B each conduct at least a portion the currents IDA and IDB simultaneously, but the portion of the current IDA that is flowing through the compensation transistors 424PA, at point B2, for example, is greater than the portion of the current IDB that is flowing through the compensation transistors 424PB. Similarly, the differential pairs 422B and 422C will be conducting different portions of the currents IDB and IDC, at point B1 for example, through the respective compensation transistors 424PB and 424PC.

In an exemplary aspect, as shown in the graphic diagram in FIG. 5, a total current $ID_{TTL}$ (normalized to the magnitudes of the currents IDA, IDB, and IDC) is a summation of the portions of the currents IDA, IDB, and IDC flowing through the respective compensation transistors 424PA, 424PB, and 424PC. The offset compensation voltage $V_{COMP}$ provided to the positive and negative internal nodes 416P and 416N is determined by the total current $ID_{TTL}$. The total current $ID_{TTL}$ remains linear over a greater range of the compensation control voltage $V_{CTL}$ than any of the currents IDA, IDB, and IDC. Thus, an effect of replacing the differential pair 208 in FIG. 2 with the multi-tan h circuit 406 in FIG. 4 is to provide an increased range of linearity in the compensation of the cumulative offset voltage $V_{OFFSET}$ in response to the compensation control voltage $V_{CTL}$. For comparison, in contrast to the linear range of the current IDB of the differential pair 422B between points B1 and B2, the total current $ID_{TTL}$ is linear over a larger range of the compensation control voltage $V_{CTL}$ between points T1 and T2.

In addition, a change in magnitude of the total current $ID_{TTL}$ in the linear range between points T1 and T2 is less than a change in magnitude of the current IDB. Thus, the granularity of the offset compensation voltage $V_{COMP}$ provided by the total current $ID_{TTL}$ is finer than granularity of, for example, the differential pair 422B alone. In other words, compared to the op-amp 102 in FIG. 2, it is possible to make smaller adjustments to the offset compensation voltage $V_{COMP}$ provided to the positive and negative internal nodes 416P and 416N of the diff-amp 402 in response to a change of the compensation control voltage $V_{CTL}$. In this regard, the offset compensation voltage $V_{COMP}$ provided by the multi-tan h circuit 406 can more precisely compensate the diff-amp output voltage $V_{OUT}'$ for the cumulative offset voltage $V_{OFFSET}$.

Although the multi-tan h circuit 406 in FIG. 4 includes a three differential pairs 422A, 422B, and 422C, a multi-tan h circuit as disclosed herein may include at least two and up to any beneficial number of differential pairs to increase linearity of the compensation provided to a differential amplifier.

Figure 6A:
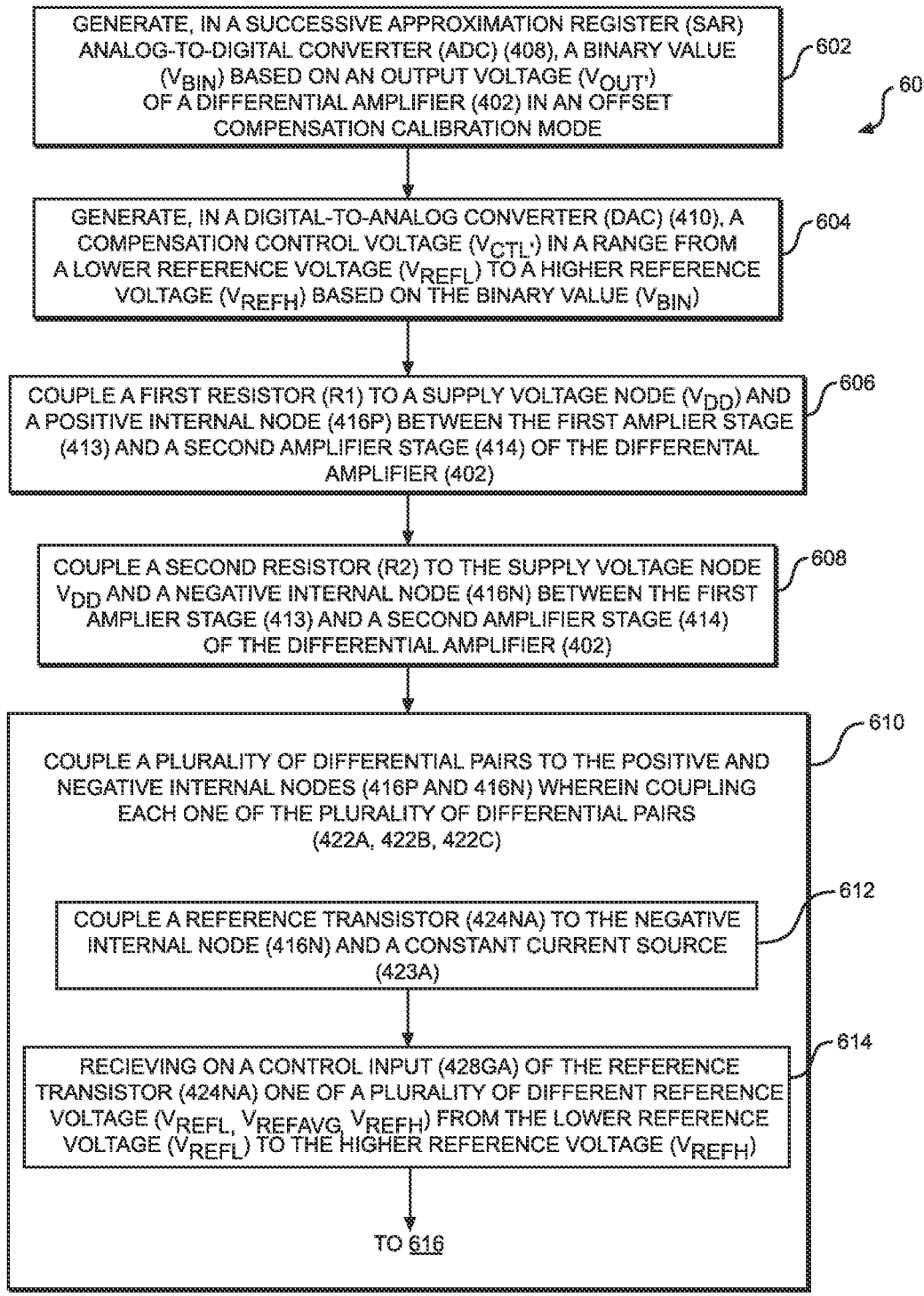
FIGS. 6A and 6B are a flowchart illustrating an exemplary process of compensating offset voltage in a differential amplifier based on the exemplary differential amplifier and offset compensation circuit of FIG. 4.
Figure 6B:
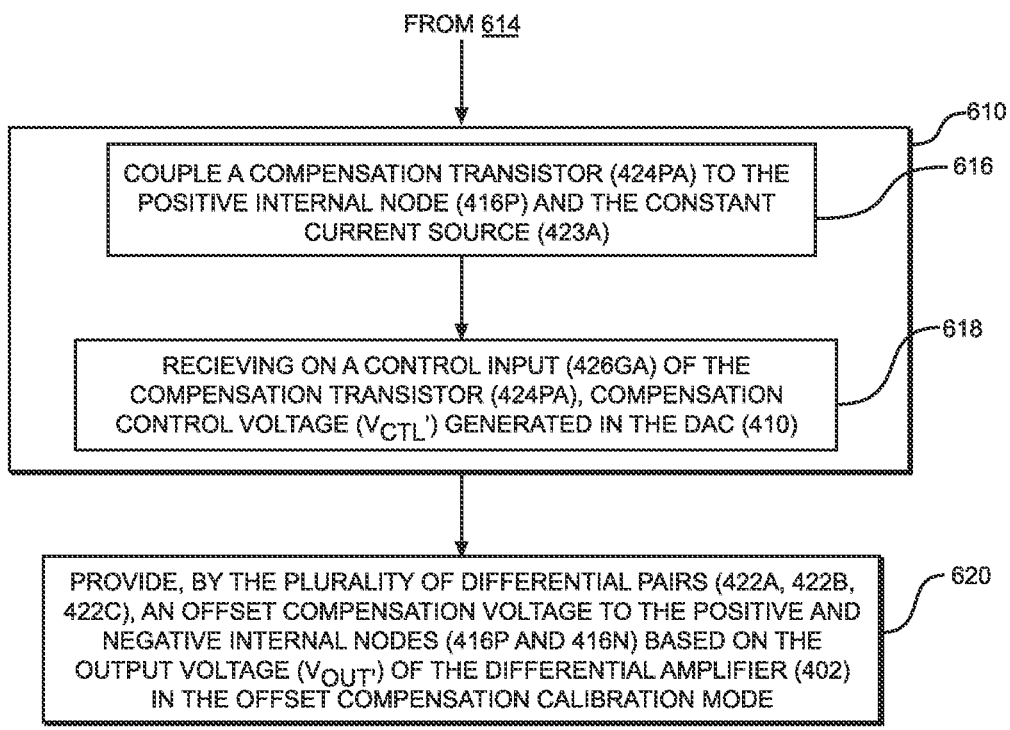

FIG. 6 is a flowchart of a method 600 of compensating an offset voltage in a differential amplifier. The method includes generating, in a successive approximation register (SAR) analog-to-digital converters (ADC) (408), a binary value ($V_{BIN}$) based on an output voltage ($V_{OUT}'$) of a differential amplifier (402) in an offset compensation calibration mode (block 602). The method 600 includes generating, in a digital-to-analog converter (DAC) (410), a compensation control voltage ($V_{CTL}'$) in a range between a lower reference voltage ($V_{REFL}$) and a higher reference voltage ($V_{REFH}$) based on the binary value ($V_{BIN}$) (block 604). The method further includes coupling a first resistor (R1) to a supply voltage node $V_{DD}$ and a positive internal node (416P) between the first amplifier stage (413) and a second amplifier stage (414) of the differential amplifier (402) (block 606). The method further includes coupling a second resistor (R2) to the supply voltage node $V_{DD}$ and a negative internal node (416N) between the first amplifier stage (413) and a second amplifier stage (414) of the differential amplifier (402) (block 608). The method further includes coupling a plurality of differential pairs to the positive and negative internal nodes (416P and 416N) wherein coupling each one of the plurality of differential pairs (422A, 422B, 422C) (block 610) comprises coupling a reference transistor (424NA) to the negative internal node (416N) and a constant current source 423A (block 612), receiving, on a control input (428GA) of the reference transistor (424NA), one of a plurality of different reference voltages (e.g., $V_{REFL}$, $V_{REFAVG}$, $V_{REFH}$) from the lower reference voltage $V_{REFL}$ to the higher reference voltage $V_{REFH}$ (block 614), coupling a compensation transistor (424PA) to the positive internal node (416P) and the constant current source (423A) (block 616), and receiving, on a control input (426GA) of the compensation transistor (424PA), the compensation control voltage ($V_{CTL}'$) generated in the DAC (410) (block 618). The method also includes providing, by the plurality of differential pairs (422A, 422B, 422C), offset compensation voltage to the positive and negative internal nodes (416P and 416N) based on the output voltage (Your') of the differential amplifier (402) in the offset compensation calibration mode (block 620).

FIG. 7 is a schematic diagram of the exemplary offset compensated differential amplifier system 700 corresponding to the offset compensated differential amplifier system 400 in FIG. 4 including a diff-amp 702 and compensation calibration circuits 703A and 703B. The diff-amp 702 includes an offset compensation circuit 704 that employs a multi-tan h circuit 706 to provide offset voltage compensation with finer granularity and increased linear range than the automatically calibrating op-amp system 100 of FIGS. 1 and 2. The offset compensated differential amplifier system 700 in FIG. 7 includes an input control circuit 708 including a coupling capacitor 710P coupled to the positive primary input voltage $VIP_P$ and a coupling capacitor 710N coupled to the negative primary input voltage $VIP_N$. The coupling capacitors 710P and 710N allow AC (alternating current) or time varying primary differential voltage VPD to pass to the diff-amp 702 but block DC (direct-current) voltage. The input control circuit 708 also includes resistor tree 711 providing a common mode voltage to the positive primary input voltage $VIP_P$ and the negative primary input voltage $VIP_N$. The resistor tree 711 includes resistors R4 and R5. Resistor R4 is coupled to the positive primary input voltage $VIP_P$ and the supply voltage node $V_{DD}$. Resistor R5 is coupled to the negative primary input voltage $VIP_N$ and the supply voltage node $V_{DD}$. The input control circuit 708 also includes a positive input switch 712P and a negative input switch 712N that disconnect the positive primary input voltage $VIP_P$ and the negative primary input voltage $VIP_N$, respectively, from an external circuit in response to the offset compensation calibration mode.

FIG. 8 is a block diagram of an exemplary processor-based system 800 that includes a processor 802 (e.g., a microprocessor) that includes an instruction processing circuit 804. The processor-based system 800 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 800 includes the processor 802. The processor 802 represents one or more general-purpose processing circuits, such as a microprocessor, central processing unit, or the like. More particularly, the processor 802 may be an EDGE instruction set microprocessor, or other processor implementing an instruction set that supports explicit consumer naming for communicating produced values resulting from execution of producer instructions. The processor 802 is configured to execute processing logic in instructions for performing the operations and steps discussed herein. In this example, the processor 802 includes an instruction cache 808 for temporary, fast access memory storage of instructions accessible by the instruction processing circuit 804. Fetched or prefetched instructions from a memory, such as from a main memory 810 over a system bus 812, are stored in the instruction cache 808. The instruction processing circuit 804 is configured to process instructions fetched into the instruction cache 808 and process the instructions for execution.

The processor 802 and the main memory 810 are coupled to the system bus 812 and can intercouple peripheral devices included in the processor-based system 800. As is well known, the processor 802 communicates with these other devices by exchanging address, control, and data information over the system bus 812. For example, the processor 802 can communicate bus transaction requests to a memory controller 819 in the main memory 810 as an example of a slave device. Although not illustrated in FIG. 8, multiple system buses 812 could be provided, wherein each system bus constitutes a different fabric. In this example, the memory controller 819 is configured to provide memory access requests to a memory array 820 in the main memory 810. The memory array 820 is comprised of an array of storage bit cells for storing data. The main memory 810 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 812. As illustrated in FIG. 8, these devices can include the main memory 810, one or more input device(s) 822, one or more output device(s) 824, a modem 826, and one or more display controllers 828, as examples. The input device(s) 822 can include any type of input device, including but not limited to input keys, switches, voice processors, etc. The output device(s) 824 can include any type of output device, including but not limited to audio, video, other visual indicators, etc. The modem 826 can be any device configured to allow exchange of data to and from a network 830. The network 830 can be any type of network, including but not limited to a wired or wireless network, a private or public network, a local area network (LAN), a wireless local area network (WLAN), a wide area network (WAN), a BLUETOOTH™ network, and the Internet. The modem 826 can be configured to support any type of communications protocol desired. The processor 802 may also be configured to access the display controller(s) 828 over the system bus 812 to control information sent to one or more displays 832. The display(s) 832 can include any type of display, including but not limited to a cathode ray tube (CRT), a liquid crystal display (LCD), a plasma display, etc. Any of the devices coupled to the system bus 812 may include an offset compensated differential amplifier system 400 as shown in FIG. 4 including a multi-tan h circuit for increased linear range and finer granularity compensation of a cumulative offset voltage.

The processor-based system 800 in FIG. 8 may include a set of instructions 834 to be executed by the processor 802 for any application desired according to the instructions. The instructions 834 may be stored in the main memory 810, processor 802, and/or instruction cache 808 as examples of a non-transitory computer-readable medium 836. The instructions 834 may also reside, completely or at least partially, within the main memory 810 and/or within the processor 802 during their execution. The instructions 834 may further be transmitted or received over the network 830 via the modem 826, such that the network 830 includes computer-readable medium 836.

While the computer-readable medium 836 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An offset compensated differential amplifier comprising:
   a first amplifier stage configured to generate a first output differential voltage on a positive internal node and a negative internal node based on a primary differential voltage;
   a second amplifier stage coupled to the positive internal node and the negative internal node and configured to generate an output voltage based on an intermediate differential voltage on the positive internal node and the negative internal node; and
   an offset compensation circuit comprising:
      a first resistor configured to couple to a supply voltage node and to the positive internal node;
      a second resistor configured to couple to the supply voltage node and to the negative internal node; and
      a multi-tan h circuit comprising:
         a plurality of constant current sources; and
         a plurality of differential pairs, each differential pair comprising:
            a compensation transistor configured to couple to the positive internal node and to a current input of a corresponding one of the plurality of constant current sources, the compensation transistor comprising a compensation control input configured to receive a compensation control voltage; and
            a reference transistor configured to couple to the negative internal node and to the current input of the corresponding one of the plurality of constant current sources, the reference transistor comprising a control input configured to receive one of a plurality of different reference voltages;
         wherein:
            the plurality of differential pairs supplies an offset compensation voltage to the positive and negative internal nodes based on the compensation control voltage and the plurality of different reference voltages; and
            the intermediate differential voltage is based on the first output differential voltage and the offset compensation voltage.

2. The offset compensated differential amplifier of claim 1, wherein:
   the compensation transistor in each of the plurality of differential pairs is configured to receive the compensation control voltage from a lower reference voltage to a higher reference voltage.

3. The offset compensated differential amplifier of claim 2, wherein:
   each reference transistor in the plurality of differential pairs is configured to receive the one of the plurality of different reference voltages from the lower reference voltage to the higher reference voltage.

4. The offset compensated differential amplifier of claim 1, wherein:
   each of the plurality of constant current sources is configured to conduct a constant first current through a corresponding differential pair.

5. The offset compensated differential amplifier of claim 1, wherein the first resistor comprises a first resistance and the second resistor comprises the first resistance.

6. The offset compensated differential amplifier of claim 1, further comprising a third resistor comprising a first terminal coupled to the first resistor and the second resistor and a second terminal coupled to the supply voltage node.

7. The offset compensated differential amplifier of claim 1, wherein:
   the first amplifier stage is configured to generate the first output differential voltage based on the primary differential voltage and a first offset voltage; and
   the second amplifier stage is configured to generate the output voltage based on the intermediate differential voltage, the offset compensation voltage, and a second offset voltage;
   wherein the offset compensation voltage reduces an offset in the output voltage due to the first offset voltage and the second offset voltage.

8. An offset compensated differential amplifier system comprising:
   an offset compensated differential amplifier, comprising:
      a positive primary input and a negative primary input;
      a first amplifier stage configured to generate a first output differential voltage on a positive internal node and a negative internal node based on a primary differential voltage on the positive and negative primary inputs;

a second amplifier stage coupled to the positive internal node and the negative internal node and configured to generate an output voltage based on an intermediate differential voltage on the positive internal node and the negative internal node; and an offset compensation circuit comprising:
  a first resistor configured to couple to a supply voltage node and to the positive internal node;
  a second resistor configured to couple to the supply voltage node and to the negative internal node; and
  a multi-tan h circuit comprising:
    a plurality of constant current sources; and
    a plurality of differential pairs, each differential pair comprising:
      a compensation transistor configured to couple to the positive internal node and to a current input of a corresponding one of the plurality of constant current sources, the compensation transistor comprising a compensation control input configured to receive a compensation control voltage; and
      a reference transistor configured to couple to the negative internal node and to the current input of the corresponding one of the plurality of constant current sources, the reference transistor comprising a control input configured to receive one of a plurality of different reference voltages;
  wherein:
    the plurality of differential pairs supplies an offset compensation voltage to the positive and negative internal nodes based on the compensation control voltage and the plurality of different reference voltages; and
    the intermediate differential voltage is based on the first output differential voltage and the offset compensation voltage; and a compensation calibration circuit comprising:
  a switch configured to electrically short the positive primary input to the negative primary input in response to an offset compensation calibration mode;
  a successive approximation register (SAR) analog-to-digital converter (ADC) coupled to the second amplifier stage and configured to generate a binary value based on the output voltage in response to the offset compensation calibration mode; and
  a digital-to-analog converter (DAC) configured to generate the compensation control voltage based on the binary value.

9. The offset compensated differential amplifier system of claim 8, wherein:
  the compensation transistor in each of the plurality of differential pairs is configured to receive the compensation control voltage from a lower reference voltage to a higher reference voltage.

10. The offset compensated differential amplifier system of claim 9, wherein:
  each reference transistor in the plurality of differential pairs is configured to receive the one of the plurality of different reference voltages from the lower reference voltage to the higher reference voltage.

11. The offset compensated differential amplifier system of claim 10, wherein:
  the plurality of differential pairs comprises three (3) differential pairs;
  the reference transistor in one of the plurality of differential pairs is configured to receive a reference voltage comprising an average voltage of the lower reference voltage and the higher reference voltage;
  the reference transistor in one of the plurality of differential pairs is configured to receive a reference voltage between the average voltage and the lower reference voltage and the higher reference voltage; and
  the reference transistor in one of the plurality of differential pairs is configured to receive a reference voltage between the average voltage and the higher reference voltage.

12. The offset compensated differential amplifier system of claim 8, wherein:
  the binary value comprises N bits;
  the DAC is further configured to generate the compensation control voltage between a lower reference voltage and a higher reference voltage; and
  the compensation control voltage comprises one of $2^N$ incremental voltages from the lower reference voltage to the higher reference voltage.

13. The offset compensated differential amplifier system of claim 8, wherein each of the plurality of constant current sources is configured to conduct a constant first current through a corresponding differential pair.

14. The offset compensated differential amplifier system of claim 8, wherein the first resistor comprises a first resistance and the second resistor comprises the first resistance.

15. The offset compensated differential amplifier system of claim 8, further comprising:
  a third resistor coupled to the positive primary input and the supply voltage node; and
  a fourth resistor coupled to the negative primary input and the supply voltage node;
  wherein the third and fourth resistors are configured to set a common mode voltage on the positive primary input and the negative primary input.

16. The offset compensated differential amplifier system of claim 8, the offset compensated differential amplifier further comprising a voltage converter circuit, wherein:
  the second amplifier stage is configured to generate the output voltage as a differential voltage signal on a positive output and a negative output; and
  the voltage converter circuit is coupled to the positive output and the negative output and is configured to generate the output voltage on a single-ended output coupled to the SAR ADC.

17. The offset compensated differential amplifier system of claim 8, further comprising:
  a positive input switch configured to disconnect the positive primary input from an external circuit in response to the offset compensation calibration mode; and
  a negative input switch configured to disconnect the negative primary input from the external circuit in response to the offset compensation calibration mode.

18. A method of compensating an offset voltage in a differential amplifier, the method comprising:
  generating, in a successive approximation register (SAR) analog-to-digital converter (ADC), a binary value based on an output voltage of a differential amplifier in an offset compensation calibration mode;

generating, in a digital-to-analog converter (DAC), a compensation control voltage in a range from a lower reference voltage to a higher reference voltage based on the binary value;

coupling a first resistor to a supply voltage node and a positive internal node between a first amplifier stage and a second amplifier stage of the differential amplifier;

coupling a second resistor to the supply voltage node and a negative internal node between the first amplifier stage and the second amplifier stage of the differential amplifier, the positive and negative internal nodes comprising an intermediate differential voltage; and coupling a plurality of differential pairs to the positive and negative internal nodes, wherein coupling each one of the plurality of differential pairs comprises:

coupling a reference transistor to the negative internal node and a constant current source;

receiving, on a control input of the reference transistor, one of a plurality of different reference voltages from the lower reference voltage to the higher reference voltage;

coupling a compensation transistor to the positive internal node and the constant current source; and receiving, on a control input of the compensation transistor, the compensation control voltage generated in the DAC; and providing, by the plurality of differential pairs, an offset compensation voltage to the positive and negative internal nodes based on the output voltage of the differential amplifier in response to the offset compensation calibration mode.

19. The method of claim 18, further comprising:

in response to a signal indicating the offset compensation calibration mode, activating a switch to electrically short a positive primary input and a negative primary input to the first amplifier stage of the differential amplifier, wherein an intermediate offset voltage is based on an offset voltage in the first amplifier stage.

20. The method of claim 18, wherein:

generating, in the SAR ADC, the binary value comprises generating the binary value in response to the offset compensation calibration mode.

* * * * *